United States Patent
Cassinerio et al.

(10) Patent No.: US 12,294,197 B1
(45) Date of Patent: May 6, 2025

(54) SYSTEM AND CONTROLLER FOR STABILIZATION OF INJECTION-LOCKED LASER DIODE AMPLIFIERS

(71) Applicant: Keysight Technologies, Inc., Santa Rosa, CA (US)

(72) Inventors: Marco Cassinerio, San Jose, CA (US); Eric Johnstone, Redwood City, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 1193 days.

(21) Appl. No.: 17/106,329

(22) Filed: Nov. 30, 2020

Related U.S. Application Data

(60) Provisional application No. 62/982,342, filed on Feb. 27, 2020.

(51) Int. Cl.
| | |
|---|---|
| *H01S 5/0687* | (2006.01) |
| *G02F 1/21* | (2006.01) |
| *H01S 3/10* | (2006.01) |
| *H01S 3/13* | (2006.01) |
| *H01S 5/00* | (2006.01) |
| *H01S 5/024* | (2006.01) |

(52) U.S. Cl.
CPC .............. *H01S 5/0687* (2013.01); *G02F 1/21* (2013.01); *H01S 3/10069* (2013.01); *H01S 3/1305* (2013.01); *H01S 5/0085* (2013.01); *H01S 5/02415* (2013.01); *G02F 1/213* (2021.01)

(58) Field of Classification Search
CPC .. H01S 5/0687; H01S 3/10069; H01S 3/1305; H01S 5/0085; H01S 5/02415; G02F 1/21; G02F 1/213
See application file for complete search history.

(56) References Cited

U.S. PATENT DOCUMENTS

| 5,668,826 A | 9/1997 | Bezinge et al. |
| 5,982,790 A | 11/1999 | Grossman et al. |

(Continued)

OTHER PUBLICATIONS

Brendan Saxberg et al., "Active stabilization of a diode laser injection lock," Rev. Sci. Instrum. 87, 063109 (2016); https://doi.org/10.1063/1.4953589, pp. 1-6.

(Continued)

*Primary Examiner* — Yuanda Zhang

(57) ABSTRACT

A system includes a laser diode adapted to output an optical signal having a wavelength; an interferometer adapted to receive a portion of the optical signal from the laser diode; and a controller comprising a processor and coupled to the laser diode and the interferometer. The controller is connected to a memory that stores instructions, which when executed by the processor cause the processor to: receive the optical signal from the interferometer; determine a first amplitude peak of the optical signal received from the interferometer; compare the first amplitude peak to a previous amplitude peak; increase an driving current to the laser diode; determine a second amplitude peak of the optical signal received from the interferometer; compare the second amplitude peak to the first amplitude peak; and based on the comparison of the second amplitude peak to the first amplitude peak, increase or decrease the driving current to the laser diode so the optical signal received from the interferometer is maintained in a desired wavelength.

20 Claims, 5 Drawing Sheets

(56) References Cited

U.S. PATENT DOCUMENTS

2003/0165166 A1* 9/2003 Funakawa ............ H01S 5/0687
372/55
2015/0029515 A1* 1/2015 Pedersen ............ H01S 5/02251
356/519

OTHER PUBLICATIONS

Ong Jing Hao et al., "Active Stabilization of an Injection Lock," Department of Physics, Faculty of Science National University of Singapore, 2019, 53 pgs.

* cited by examiner

SYSTEM AND CONTROLLER FOR STABILIZATION OF INJECTION-LOCKED LASER DIODE AMPLIFIERS

CROSS-REFERENCE TO RELATED APPLICATIONS

This present application is claims priority under 35 U.S.C. § 119 (e) from U.S. Provisional Application 62/982,342 filed on Feb. 27, 2020, which names Marco Cassinerio and Eric Johnstone as inventors. The entire disclosure of U.S. Provisional Application 62/982,342 is specifically incorporated herein by reference.

BACKGROUND

Ultra-high precision interferometric measurements, in particular multiple axes distance metrology in lithography and similar measurement techniques, require low phase noise laser sources and shot noise limited detection. A shot noise limit is achieved when the noise of associated electronics is lower than the optical noise. As such, to meet an acceptable shot noise limit, optical sources with higher output power are required.

Certain known systems include helium-neon (HeNe) laser sources but suffer from comparatively low power output levels. These lower power output levels translate into a very low shot noise level, but unacceptable output power levels. One way to increase the output power includes use of multiple lasers, which results in undesired higher system cost and complexity. The increased in complexity in-turn impacts the reliability of the system.

What is needed, therefore, is a system that provides a stable laser-diode amplification that overcomes at least the drawbacks of the systems described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
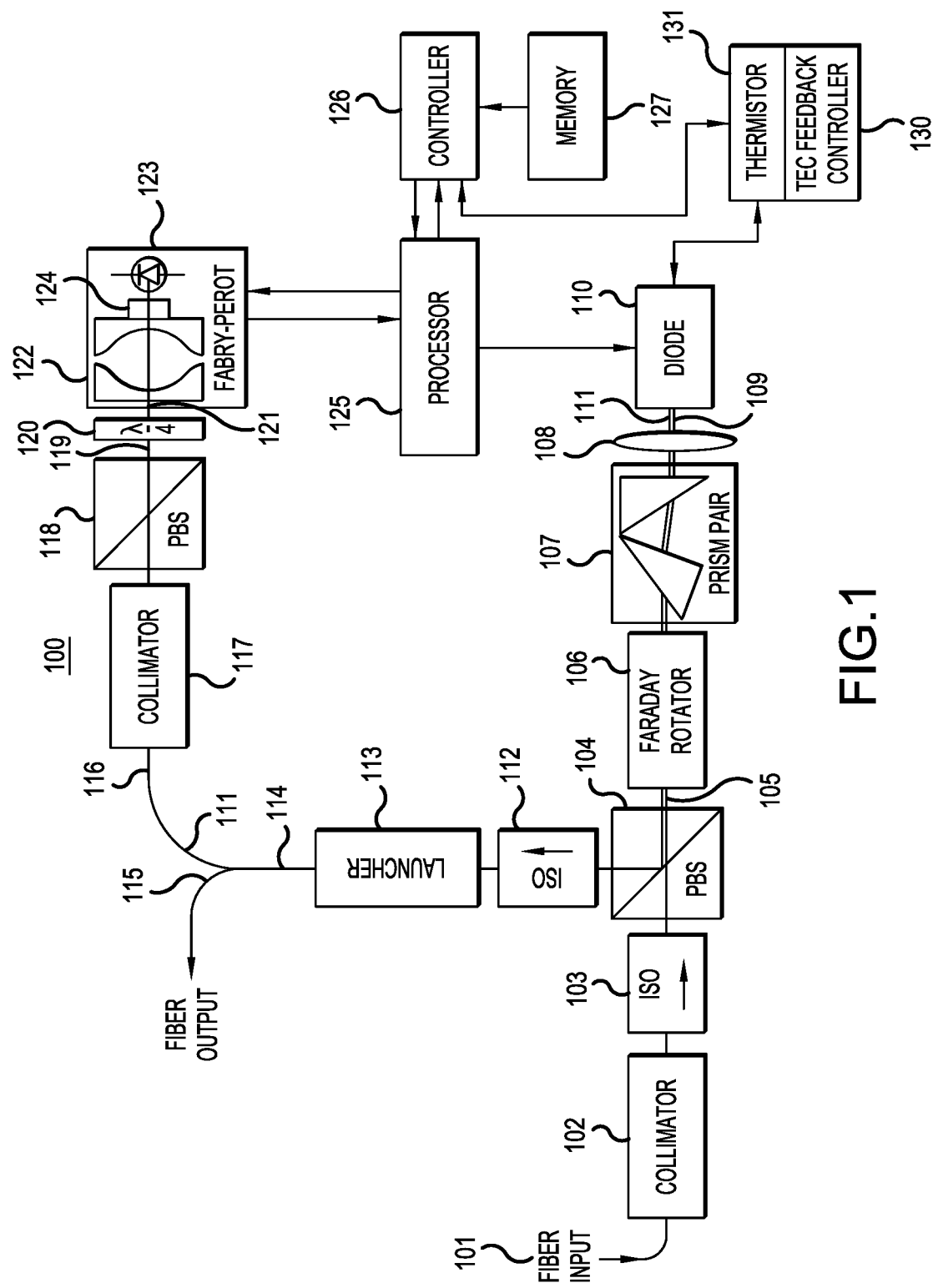
FIG. 1 is a simplified block diagram showing system for stabilization of injection-locked laser diode amplifiers accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", or "coupled to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

As described herein in connection with various representative embodiments, a system comprises: a laser diode adapted to output an optical signal having a wavelength; an interferometer adapted to receive a portion of the optical signal from the laser diode; and a controller comprising a processor and coupled to the laser diode and the interferometer. The controller comprises a memory that stores instructions, which when executed by the processor cause the processor to: receive the optical signal from the interferometer; determine a first amplitude peak of the optical signal received from the interferometer; compare the first amplitude peak to a previous amplitude peak; increase an driving current to the laser diode; determine a second amplitude peak of the optical signal received from the interferometer; compare the second amplitude peak to the first amplitude peak; and based on the comparison of the second amplitude peak to the first amplitude peak, increase or decrease the driving current to the laser diode so the optical signal received from the interferometer is maintained in a desired wavelength.

By the present teachings as described more fully below, driving current provided to the laser diode is required to keep the laser diode in the injection locked regime. Similarly, by the present teachings the temperature of the laser diode is maintained at a desired level to keep the laser diode in the injection locked regimen. Maintaining the desired driving current, or temperature, or both, is carried out using an active feedback mechanism in accordance with a representative embodiment. As described more fully below, a controller first acquires the amplified optical spectrum from a scanning Fabry-Perot interferometer and computes the power at the center wavelength. The controller then perturbs the diode pump current by a small fraction and acquires the new optical spectrum and power.

FIG. 1 is a simplified block diagram showing system 100 for stabilization of an injection-locked laser diode amplifiers accordance with a representative embodiment.

The system 100 receives an optical signal to be amplified illustratively from an input optical fiber 101. The optical signal is from a source (not shown). The optical signal and is desirably amplified and stabilized by the system 100 in accordance with the present teachings. In accordance with various representative embodiments, the source may be a laser (e.g., a HeNe laser) commonly used in metrology, such as optical interferometric distance multi-axis metrology in lithography apparatuses commonly used in semiconductor processing, for example.

The input optical signal from the optical fiber 101 is then provided to a first collimator 102 for transmission in free-space. From the first collimator 102, the input optical signal traverses a first optical isolator 103, which prevents the input optical from being reflected back to the input optical fiber 101, and ultimately back to the source, thereby preventing interference in the optical signal from the source.

The optical signal from the first optical isolator 103 is incident on a first polarization beam splitter (PBS) 104, which is illustratively a 1000:1 polarization filter. An optical signal having a first linear polarization state is transmitted as a first optical signal 105. An optical signal (not shown) having a second linear polarization, which is orthogonal to the first polarization state, is reflected downward (not shown), with little power loss. First optical signal 105 is incident on a Faraday rotator 106 element that is aligned with the input polarization of the first optical signal 105. The linearly polarized light emerges from the Faraday rotator with a linear polarization state rotated by 45° from the input state. The light is linearly polarized in the direction of the maximum gain of the laser diode.

Upon emerging from the Faraday rotator 106 the first optical signal 105 traverses an anamorphic prism pair 107. The anamorphic prism pair 107 changes the shape of the first optical signal 105 to better match the shape of the mode of the diode laser, changing the shape from a comparatively rounded shape to a more elongated shape that matches the shape of the resonant cavity of a laser diode 110, which receives the first optical signal 105 from an intervening lens 108. The lens 108 usefully focuses the first optical signal 105 into the laser diode 110 and substantially matches the beam waist and divergence parameters of the first optical signal 105 to the cavity mode parameters of the laser diode 110.

As will become clearer as the present description continues, upon emergence from the lens 108, a first optical signal 109 is injected into the laser diode 110 and emerges as a second optical signal 111, which has greater power than the first optical signal 105. That is, the first optical signal 109 injected into the laser diode 110 does stimulate the laser diode 110 to concentrate the emitted radiation at the same wavelength as the input, achieving coherent amplification (often referred to as injection locking). The amplification of the first optical signal 109 at the laser diode 110 results in the second optical signal 111 having a greater power than the incident optical signal from the input optical fiber 101 as desired in many applications. Moreover, and as will be described more clearly below, the output of the laser diode 110 is comparatively stable and has comparatively low phase and amplitude noise. So, by the present teachings, amplification of an optical signal from a source (not shown) is realized but not at the sacrifice of unacceptable phase and amplitude noise without the cost and complexity of known amplification systems.

The second optical signal 111 is again incident on the anamorphic prism pair 107 and emerges with a comparatively circular cross-section. The second optical signal 111 traverses the Faraday rotator 106 and undergoes a second 45° ($\pi/4$ radians) polarization rotation in the same direction as the first optical signal 105, emerging in a linear polarization state that is orthogonal (90° ($\pi/2$ radians)) to the first optical signal 105.

Upon incidence on the first PBS 104, the second optical signal 111 is reflected upward to a second isolator 112, which prevents reflection of the second optical signal 111 back to the first PBS 104 and elsewhere in the system 100.

The second optical signal 111 is incident on a launcher 113, which focuses the second optical signal 111 to be provided to an output optical fiber 114. The second optical signal 111 is an amplified optical signal provided to an output optical fiber 114. The second optical signal 111 is split at an optical splitter 115, with a portion of the output provided to a fiber output as shown. Notably, the portion of the output provided to the fiber output is percentage (e.g., 90%) of the power of the second optical signal 111 upon emergence from the launcher 113. This second optical signal 111 is, therefore, the first optical signal 109 amplified by the laser diode 110, and as will be described more fully below, provides a comparatively low phase noise, stable output optical signal. Moreover, the laser diode 110 does not degrade or increase the phase noise of the optical signal provided by the input optical fiber. Furthermore, the injection mechanism of the present teachings is preserved even in the case of external perturbations optical signal.

As shown in FIG. 1, upon emergence from the optical splitter 115, a portion 116 of the second optical signal 111 (e.g., 10% of the power) is incident on a third collimator 117, which like the first collimator 102 enables a signal from the output optical fiber 114 to be transmitted in free-space.

The portion 116 of the second optical signal 111 is incident on a second polarization beam splitter (PBS) 118, which is illustratively a 1000:1 polarization filter. One component 119 of the portion 116 of the second optical signal 111 emerges from the second PBS 118 having a first linear polarization state. An optical signal (not shown) having a second linear polarization state, which is orthogonal to the first linear polarization state, is reflected downward (not shown), with little power loss. The component 119 is incident on a quarter-wave plate 120, or another Faraday rotator, which changes the polarization of the incident optical signal from its incident linear polarization state, and emerges as a second portion 121 from the quarter-wave plate 120 and is circularly polarized. The second portion 121 is provided to a Fabry-Perot (F/P) resonator 122, which may comprise a fiber F/P resonator. Notably, any light reflected back to the second PBS 118 from the F/P resonator 122 is circularly rotated to a linear polarization state that is orthogonal (90° (π/2 radians)) to the component 119 its emergence from the second PBS 118, and is reflected (not shown) in upward direction and not into the output optical fiber 114. As such, the combination of the second PBS 118 and the quarter-wave plate 120 provides optical isolation by preventing any appreciable portion of an optical signal reflected from the F/P resonator 122 from being reflected back to the output optical fiber 114, to the fiber output and elsewhere in the system 100.

As described more fully below, the component 119 of the portion 116 of the second optical signal 111 incident on the F/P resonator 122 will be transmitted to a photodetector 123 if its wavelength is an eigenmode (i.e., a resonance condition) of the F/P resonator 122. Notably, when the wavelength input to the F/P resonator 122 is at a resonance wavelength, energy will build up inside the F/P resonator 122. Since the reflective element (mirrors) of the F/P resonator 122 are partially reflective, some light from the F/P resonator 122 is transmitted out of the F/P resonator 122 and provided to the photodetector 123. If the component 119 of the portion 116 of the second optical signal does not have a characteristic wavelength, it will be reflected from the F/P resonator 122. As such, and as will become clearer as the present description continues, the F/P resonator 122 functions as a spectrum analyzer, the output of which is used to ensure the wavelength of the second optical signal 111 has the same wavelength as the optical signal from the input optical fiber 101, but with increased power.

The system 100 also comprises an actuator 124, which, as described more fully below, is used to alter the spacing between the mirrors of the F/P resonator 122 to scan different resonant conditions. Thereby, the second optical signal 111 from the laser diode 110 has a comparatively precise wavelength and increased power relative to the optical signal received by the system 100 from the input optical fiber 101. In accordance with a representative embodiment, the actuator 124 may comprise a piezoelectric-based actuator, a micro-electro-mechanical system (MEMs) based device, or other similar component configured to alter the length of the cavity of the F/P resonator 122 with a desired degree of precision.

In accordance with a representative embodiment, the system 100 comprises a processor 125 that is used to alter or scan the F/P mirror spacing. As described more fully below, the processor 125 also increases, or decreases, or maintains the driving current of the laser diode 110 to maintain the output from the laser diode 110 at a desired wavelength.

The processor 125 is illustratively connected to a controller 126 and accesses a memory 127 to effect changes in the driving current of the laser diode. As will be described more fully below, the controller comprises a memory 127 that stores instructions, which when executed by the processor 125 cause the processor 125 to scan the F/P resonator and to adjust the driving current (and the temperature) of the laser diode 110 to ensure the second optical signal 111 provided at output optical fiber 114 having a desired wavelength and power level.

The controller 126 may include more than one processor, and comprises or is connected to the memory 127. The processor may include, for example, field programmable gate arrays (FPGAs), application specific integrated circuits (ASICs), microprocessors, computer processors, or combinations thereof, using any combination of hardware, software, firmware, hard-wired logic circuits, or combinations thereof. The memory 127 may be implemented by any number, type and combination of random access memory (RAM) and read-only memory (ROM), for example, and may store various types of information, such as software algorithms and computer programs executable by the one or more processing devices. The various types of ROM and RAM may include any number, type and combination of computer readable storage media, such as a disk drive, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art, which are tangible and non-transitory storage media (e.g., as compared to transitory propagating signals). As noted above, and as described more fully below, the memory 127 may store software instructions and/or computer readable code that enables performance of various functions, including the switching functions.

The controller 126 may further include a user interface (not shown) for providing information and data to the user and/or for receiving information and data from the user. That is, the user interface enables the user to enter data and to control or manipulate the actuator 124, the driving current, and the temperature of the laser diode 110 to maintain the wavelength and output power of the second optical signal 111 provided to the output optical fiber 114. The user interface also enables the controller 126 to indicate the current state of the wavelength and output power of the second optical signal 111 provided to the output optical fiber 114, and the current level of the driving current, among other parameters. The user interface may provide information and data to the user via a display (not shown), which may include a graphical user interface. The user interface may receive information and data from the user via one or more of a keyboard, a mouse, a trackball, a joystick, a touchpad, and a touch screen, for example.

A specific combination of operating temperature and current is required to keep the laser diode 110 in the injection locked regime. Notably, the operating temperature and driving current levels are also affected by environmental perturbations. Therefore, by the present teachings an active feedback mechanism is used to keep the system 100 stable, thereby providing the second optical signal 111 to the output optical fiber 114 having a desired wavelength and power level. As such, in operation, as described more fully below, the processor 125 first acquires the amplified optical spectrum from the photodetector 123 that receives the optical signal from the F/P resonator 122 that is scanning based on the changes in the cavity length provided by the movement of the actuator 124, which is controlled by a ramp applied voltage as discussed below in connection with FIG. 3. Next, the processor 125 computes the power on the center wavelength from the photodetector 123. The processor 125 then perturbs the driving current provided to the laser diode 110 by a small fraction of its present level, and acquires the new optical spectrum and power from the photodetector 123. The comparison of the two power values provides the error signal for closing the feedback loop comprising the laser diode 110, the optical path to the F/P resonator 122, the F/P resonator 122, the photodetector 123, the processor 125 and the memory 127 on the driving current to the laser diode 110.

Finally, the system 100 comprises a thermoelectric cooler (TEC) feedback controller 130 and a thermistor 131. The TEC feedback controller 130 is illustratively a thermoelectric cooler with a feedback loop including readings from the thermistor 131 and adjustments in temperature based on commands from the processor 125. The TEC feedback controller 130 is thus known to the ordinarily skilled artisan to control the temperature of semiconductor devices such as laser diode 110. The thermistor 131 provides regular temperature readings from the laser diode 110 to the processor 125. The processor 125 using instructions stored in memory effects changes in the operation of the TEC feedback controller 130 to maintain the operating power of the laser diode 110. Further details of the function of the TEC feedback controller 130 in connection with the thermistor 131, the controller 126 and the memory 127 are described more fully below in connection with representative embodiments of FIG. 5.

Figure 2:
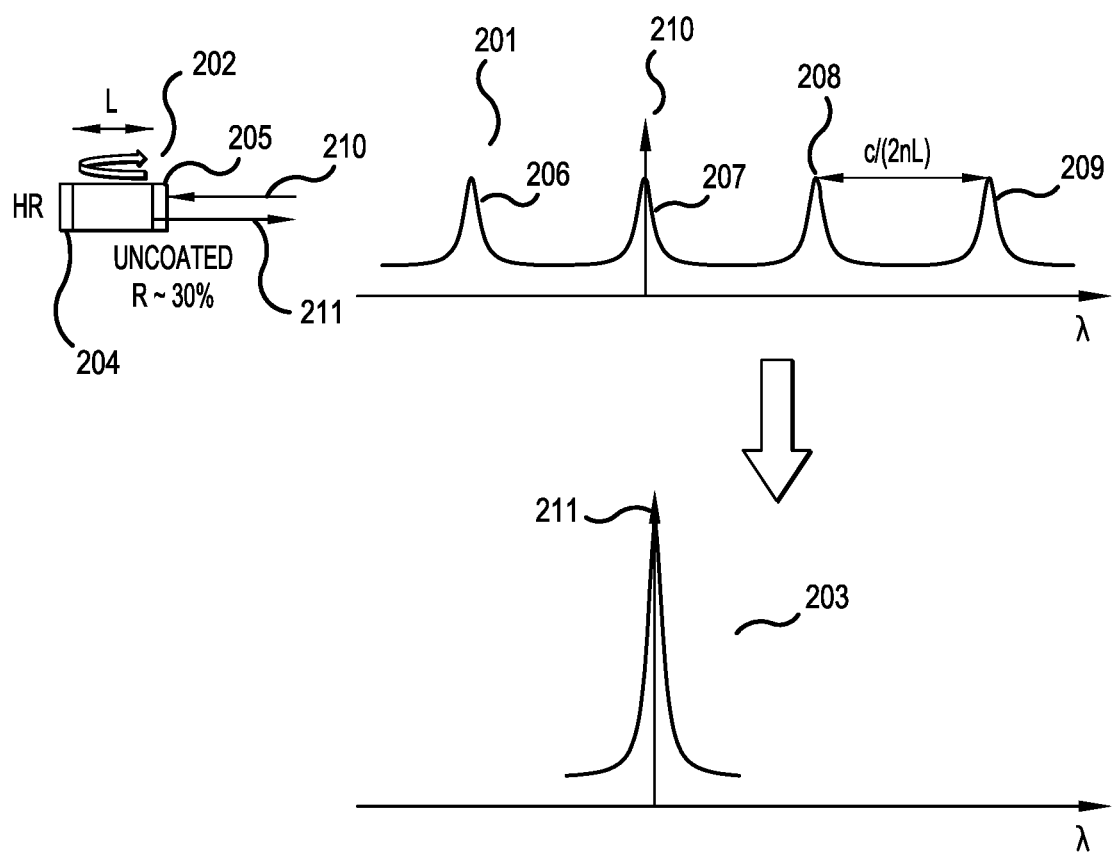
FIG. 2 illustrates an output spectrum of an unlocked laser diode, and the output spectrum of an injection-locked laser diode in accordance with a representative embodiment.

FIG. 2 illustrates an output spectrum 201 (wavelength (λ) v. amplitude) of an unlocked (i.e., free running) laser diode 202, and the output spectrum 203 of an injection-locked laser diode in accordance with a representative embodiment. Notably, the injection-locked laser diode is contemplated for use as laser diode 110 described above in accordance with certain representative embodiments. Certain aspects and details of the description of representative embodiments of FIG. 2 are common to various aspects and details of the system 100 of FIG. 1. These aspects and details may not be repeated to avoid obscuring the description of the representative embodiments of FIG. 2.

The unlocked laser diode 202 has a cavity length L as shown, and comprises a highly reflective back surface 204, and a comparatively low reflection front surface 205. As will be appreciated by one of ordinary skill in the art, the laser diode 202 has eigenmodes 206~209 having wavelengths that are spaced apart by (c/2 nL) where c is the speed of light, n the index of refraction of the semiconductor material of the laser diode 202, and L is the cavity length.

In operation, an optical signal 210 is injected into the laser diode 202, and emerges as an amplified optical signal 211 from the laser diode 202. To this end, when the injected optical signal 210 has a wavelength that is the same as the wavelength of an eigenmode (in this case eigenmode 207). This power dominant mode emerges from the laser diode 202 and has the wavelength of the selected eigenmode (again eigenmode 207) and output spectrum 203, which has substantially greater power than any of the eigenmodes 206~209 in the unlocked laser diode 202.

As alluded to above, and as described more fully below, the cavity length L of the F/P resonator 122 is set to a length that allows the output wavelength (i.e., of second optical signal 111) of the laser diode 110 to be in resonance. As described more fully in connection with FIG. 3, when the laser diode 110 drifts, the output power of the second optical signal 111 also drifts, and so the power impinging onto the photodetector 123 from the component 119 of the portion 116 of the second optical signal 111 proportionately changes. As described more fully in connection with FIG. 3 below, when the laser diode 110 drifts too much, the power level of the resonant peaks drops. Specifically, the second optical signal 111 remains resonant with the F/P resonator 122 However, as noted below, the power in certain peaks are comparatively low, and comparatively wide. As such, the eigenmode of the unlocked laser diode is much noisier than when injection locked. So, and as described below, the wavelength of 111 is still in resonance but the power and the phase noise are much higher than the input from input optical fiber 101, which is not amplified anymore, resulting in a lower measured value from the photodetector 123.

The present teachings, through the feedback from the F/P resonator 122, the processor 125 adjusts the driving current to the laser diode 110 so the wavelength of the light injected into the laser diode (first optical signal 109) is the same as the wavelength of the selected resonance optical signal of the F/P resonator 122. So the wavelength of the first optical signal 109 is the same as one of the eigenmodes 206~209 of laser diode 110. In this way, and by techniques described more fully below, if the output of the laser diode 110 drifts (e.g., due to heating), the second optical signal 111 will have a different wavelength than the desired eigenmode, and the output from the F/P resonator 122 to the photodetector 123 will change. Based on the spectrum received from the photodetector 123, the driving current to the laser diode 110 is changed until its emission at the desired resonance condition is achieved.

Figure 3:
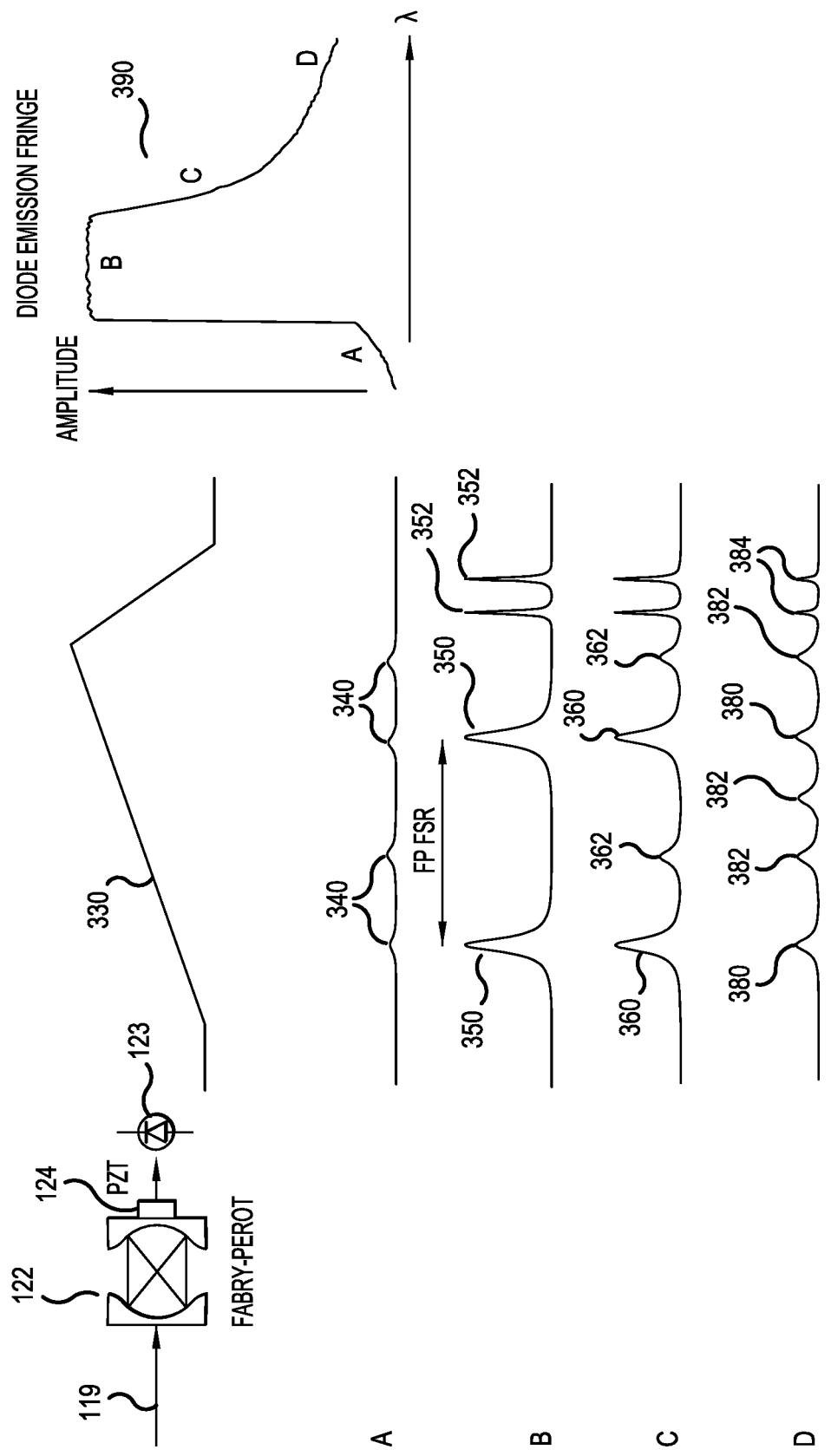
FIG. 3 depicts the output spectrum of an F/P resonator over a scan range for use in a system in accordance with a representative embodiment.

FIG. 3 depicts the output spectrum of F/P resonator 122 over a scan range for use in a system in accordance with a representative embodiment. Certain aspects and details of the description of representative embodiments of FIG. 3 are common to various aspects and details of the representative embodiments described above in connection with FIGS. 1-2. These aspects and details may not be repeated to avoid obscuring the description of the representative embodiments of FIG. 3.

As shown, component 119, which is representative of the output of a laser diode (e.g., laser diode 110) is incident on a F/P resonator 122. At resonance, component 119 is transmitted by the F/P resonator 122. By contrast, if component 119 is not at a resonance condition for the F/P resonator 122, it will be reflected, and the power spectrum will have no discernable peaks above the noise level.

Curve 330 depicts an applied voltage to an actuator 124 configured to adjust the cavity length L of the F/P resonator 122. As such, curve depicts the voltage applied to the actuator 124 versus time. Applying the ramped voltage of curve 330 alters the cavity length L and thus scans the F/P resonator 122 across a wavelength range having multiple free spectral ranges (FSR). As such, the F/P resonator 122 functions as a spectrum analyzer. Specifically, outputs A, B, C and D of FIG. 3 show the amplitude versus wavelength for four different components (i.e., component 119) provided from the laser diode 110.

Curve 390 depicts output wavelength versus amplitude of the output of the laser diode, and is referred to as the diode emission fringe of the laser diode.

Output A shows coherent, not amplified, fringes 340 that have comparatively low power, and are not discernable from noise. As such, fringes 340 are not shown in region A of curve 390 because fringes 340 are too small and too noisy to be seen. As will become clearer as the present description continues, when output A is realized, the driving current of the laser diode 110 is changed to realize more distinct and higher amplitude fringes than coherent fringes 340. Because of the comparatively large drop between regions A and B of curve 390, it is difficult to restore operation to region B once the output has fallen to region A. Accordingly, and as described more fully below, iterative scans of the F/P resonator 122, and selected perturbations of the driving current of the laser diode 110 between successive scans, are used to avoid allowing the system to operate in region A.

Output B shows coherent fringes 350 that have comparatively high power, and represent a resonance condition. A voltage (curve 330) is applied to the actuator 124 with a specific positive slope. The first of the coherent fringes 350 occurs at a specific voltage, then after increasing the voltage same fringe appears (this is called the FSR, as alluded to above). Now from the ramp of curve 330, it can be seen that the voltage is brought back with a ramp down that has a steeper slope. When the voltage applied to the actuator 124 has the same value as the one needed for the second of the coherent fringes 350, the same fringe results because the F/P is in resonance with the input light. As voltage is decreased even more, the other resonance condition that gave the coherent fringe 350 results in the other fringe 352, in a shorter period of time because of the steeper slope. As such, the two fringes 352 to the right of coherent fringes 350 are also coherent fringes.

As will be described more fully below, the driving current provided to the laser diode 110 from the processor 125 is selected to maintain the output optical signal from the laser diode (i.e., second optical signal 111) at a wavelength to realize the condition of output B. Specifically, when the second (output) optical signal 111 results in output B, its wavelength is at a desired resonance condition of the laser diode 110. Because output B is the desired output from the F/P resonator 122, the driving current provided to the laser diode 110 is maintained unless and until the spectrum changes from that of output B. As will become clearer as the present description continues, through iterative scans of the F/P resonator 122 and selected perturbations of the driving current of the laser diode 110 between successive scans, to determine if adjustments are needed to maintain operation in region B.

Output C shows coherent fringes 360, and fringes 362, which have amplitudes that are less than those of coherent fringes 360. The power spectrum of output C shows some injection of an optical signal to the laser diode 110 near a resonance condition, with the coherent fringes 360 having a lower amplitude that is less than coherent fringes 350 of output B. As will be described more fully below, the driving current provided to the laser diode 110 from the processor 125 is adjusted to change the output optical signal (i.e., second optical signal 111) from the laser diode 110 to a wavelength to realize the condition of output B. Specifically, when the second optical signal 111 results in output C, its wavelength is near, but not at, a desired resonance condition of the laser diode 110. As will become clearer as the present description continues, because output B is the desired output from the F/P resonator 122, the driving current provided to the laser diode 110 is changed until the spectrum changes to that of output B. As will become clearer as the present description continues, through iterative scans of the F/P resonator 122 and selected perturbations of the driving current of the laser diode 110 between successive scans, if the scan reveals operation in region C, increasing the current to the laser diode will increase wavelength of the eigenmode of the laser diode 110 and shifts curve 390 to the left.

Output D shows coherent fringes 380, fringes 382 and fringes 384. Coherent fringes 380 have amplitudes that are significantly less than those of coherent fringes 360. Fringes 382 have amplitudes that are less than those of coherent fringes 380; and fringes 384 are the replica of coherent fringes 380 just like fringes 352 are the replica of coherent fringes 350.

The power spectrum of output D shows injection at coherent fringes 380, however with comparatively lower amplification compared to coherent fringes 360. Notably, recovery from this state can be effected decreasing the drive current but since the signal amplitude is low and the coherent fringes 380 can be confused with fringes 382 it is difficult and may lead to an undesired state, i.e. being stuck in region D or region C). As will be described more fully below, the driving current provided to the laser diode 110 from the processor 125 is adjusted to change the output optical signal from the laser diode (i.e., second optical signal 111) to a wavelength to realize the condition of output B. Specifically, when the second optical signal 111 results in output D, its wavelength is not at a desired resonance condition of the laser diode 110. As will become clearer as the present description continues, because output B is the desired output from the F/P resonator 122, the driving current provided to the laser diode 110 is changed until the spectrum changes to that of output B.

Finally, curve 390 is a resonant fringe (eigenmode) diagram showing the signal amplitude as a function of wavelength 2 at the output of the laser diode 110

As shown, region A of the emission fringe results in a comparatively low amplitude and noise, and is associated with output A. As described more fully below, in accordance with various representative embodiments when the output of the laser diode 110 is in region A the first optical signal 109 is not at resonance with one of the eigenmodes (or fringes) of the laser diode 110. Decreasing the driving current to the laser diode 110 shifts the curve to the right (towards a lower wavelength), and reduces the emission wavelength of the eigenmode of the laser diode 110. If the driving current to the laser diode 110 is increased, the 390 curve will move to the left, which corresponds to a longer or higher wavelength.

Region B, by contrast, provides the highest amplitude, and is associated with output B. As described more fully below, in accordance with various representative embodiments, when the output of the laser diode 110 is in region B the first optical signal 109 is at a resonance condition of laser diode 110, and no adjustments are necessary to the driving current of the laser diode 110. However, as noted above, since it is desirable to maintain operation in the comparatively high amplitude and flat region B over a comparatively larger wavelength range, through iterative scans of the F/P resonator 122 and selected perturbations of the driving current of the laser diode 110 between successive scans, if the scan reveals operation in region C, decreasing the current to the laser diode will decrease the emission wavelength and shifts curve 390 to the right. (and so bringing the output of the laser diode back to region B.

Region C of the emission fringe results in an output amplitude that is lower than that of region B, but greater than that of region A. As described more fully below, in accordance with various representative embodiments, when the output of the laser diode 110 is in region C, the input signal (i.e., first optical signal 109) is close to the resonance fringe of the laser diode 110. Decreasing the driving current of the laser diode 110 shifts the curve to the right (towards a lower wavelength), eventually terminating when the output spectrum from the laser diode 110 is no longer in region C, but rather is in region B. Moreover, and as noted to above, because operation in region B is desired, if, as a result of the between-scan perturbation of the driving current of the laser diode 110 by the processor 125, the next scan indicates operation in region C, decreasing the driving current of the laser diode will decrease the emission wavelength and shift curve 390 to the right and back to operation in the B region.

Region D of the emission fringe results in an output amplitude that is approximately the same as that of region A. As described more fully below, in accordance with various representative embodiments, when the laser diode 110 is operating in region D, the input signal (i.e., first optical signal 109) is not at a resonance condition with the laser diode 110. Decreasing the driving current of the laser diode 110 shifts the curve to the right (towards a lower wavelength), eventually terminating when the output spectrum from the laser diode 110 is no longer operating in region D, but rather is in region B.

Figure 4:
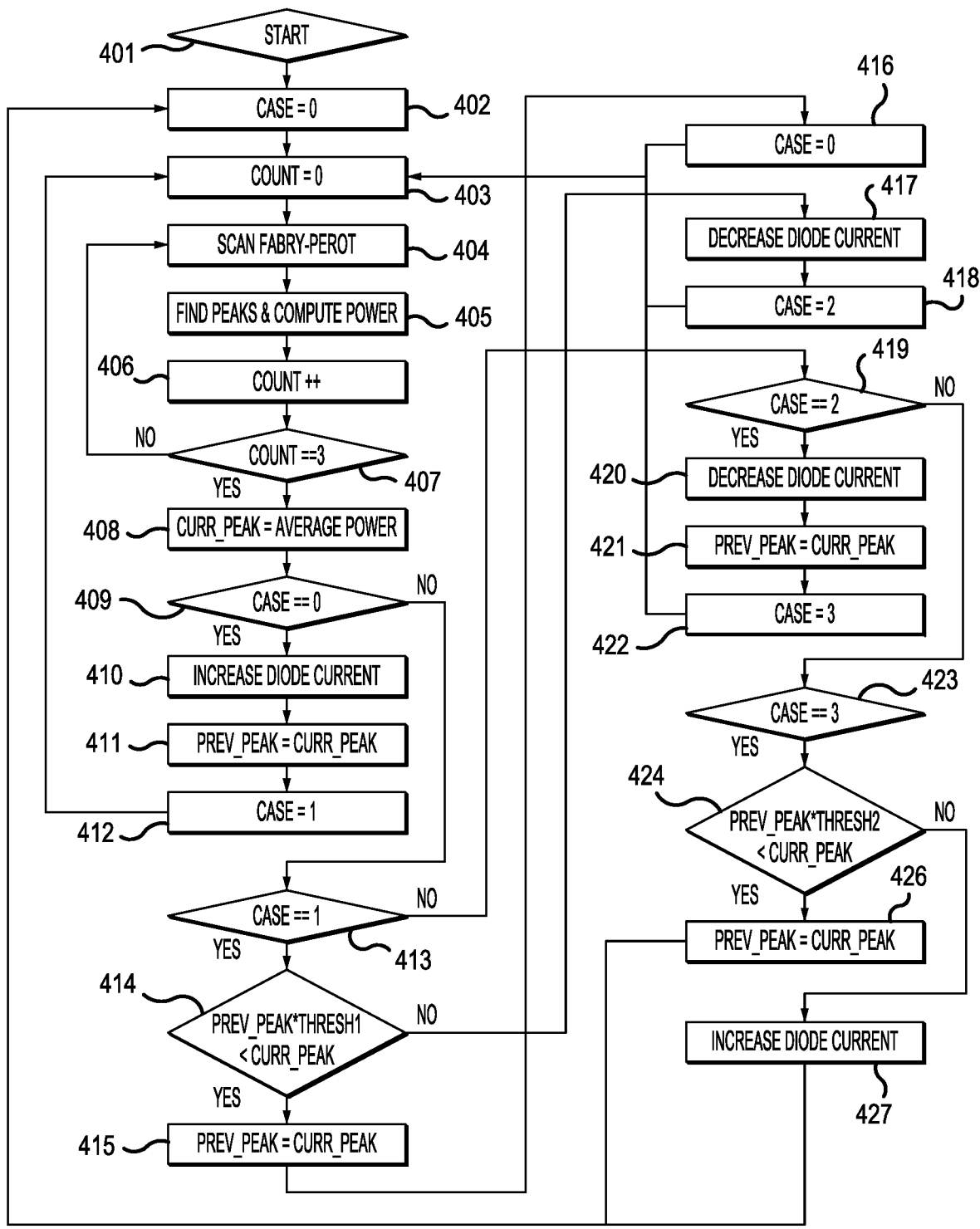
FIG. 4 is a flow-chart of a method of stabilizing an output of a laser diode in accordance with a representative embodiment.
Figure 5:
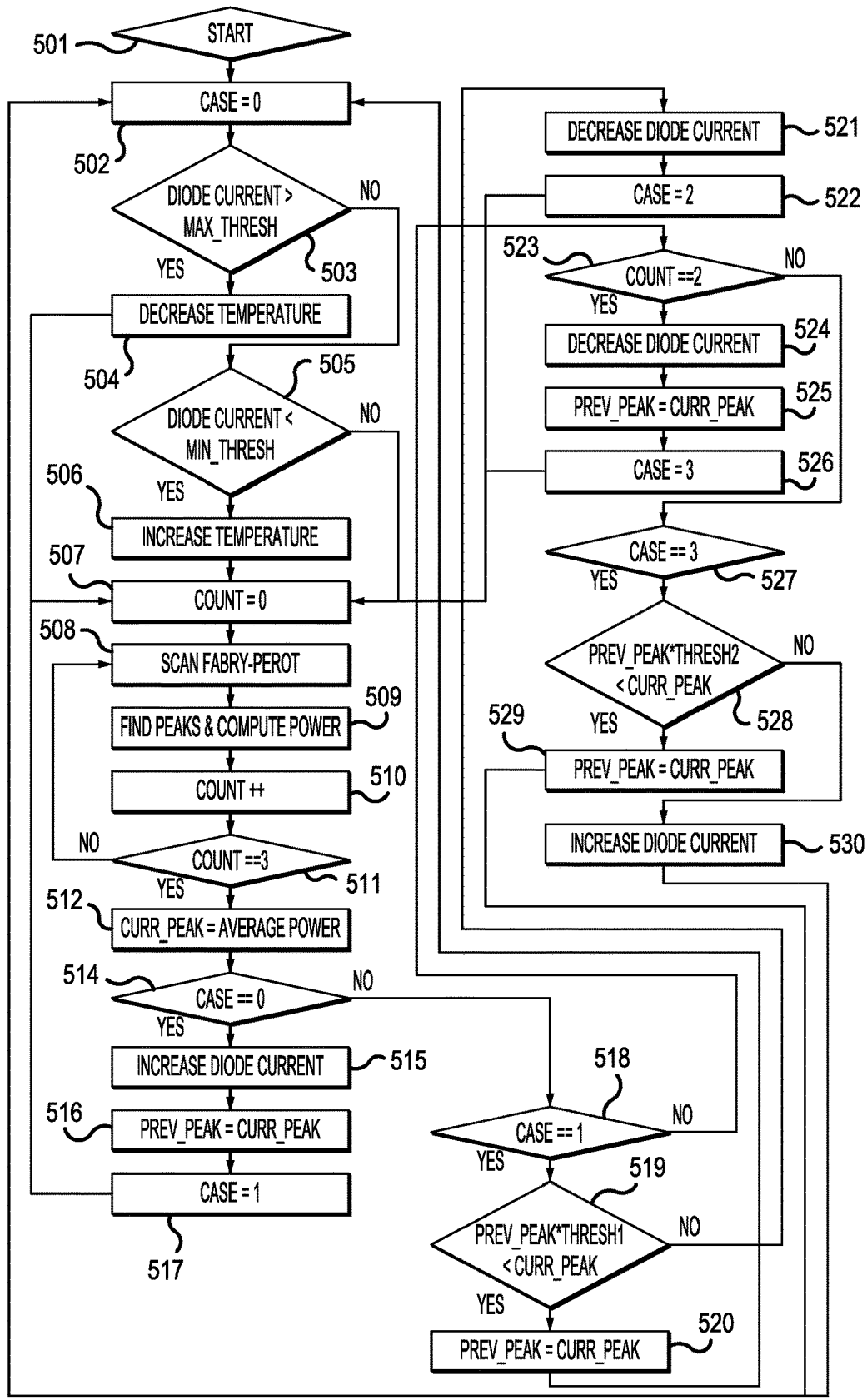
FIG. 5 is a flow-chart of a method of stabilizing an output of a laser diode in accordance with another representative embodiment.

As noted above, it is beneficial to maintain operation of the laser diode 110 so operation is in the region B. By the present teachings, scans of the F/P resonator 122 are made continually to generate the output spectrum of the F/P resonator 122, and thus the laser diode 110 to ensure a desired output power is achieved. Moreover, because of the consistent amplitude in the relative flat region B, maintaining the operating output in region B will result in a comparatively stable output signal from the laser diode 110. FIGS. 4 and 5 show applications of perturbations of the driving current, and driving current and temperature, respectively, in between scans of the F/P resonator 122 to determine the impact of the perturbations on the emitted optical spectrum. Based on the spectra that result from the perturbation, any necessary adjustments can be made to the driving current provided to the laser diode 110 by the processor 125 to return operation to or maintain operation in region B. The magnitude of the perturbation is kept comparatively low to avoid driving operation of the laser diode 110 to region A or region D of curve 390.

Just by way of illustration, and before discussing various aspects of FIGS. 4 and 5, suppose the laser diode 110 is providing an output signal that results in operation in either region A or region D. In this case, because of their comparable amplitudes, it may be difficult to determine in which region the laser diode 110 is operating. As described more fully below, if it is unclear whether the laser diode 110 is operating in either region A or region D, between scans of the F/P resonator 122 for spectrum acquisition, a perturbation in the driving current may be carried out. If a small increase in the driving current of the laser diode 110 results in a significant increase in the amplitude of the signal from the F/P resonator 122, it is clear that the laser diode 110 is operating in region A, with the perturbation's resulting in an increase in the amplitude. By contrast, if a small decrease in the driving current of the laser diode 110 results in a significant increase in the amplitude of the signal from the F/P resonator 122, it is clear that the laser diode 110 is operating in region D, with the perturbation's resulting an increase in the amplitude.

Similarly, between scans of the F/P resonator 122, a small increase (i.e., perturbation) in the driving current provided to the laser diode 110 will result in a shift the output to a longer wavelength on the curve 390. If the system 100 is currently operating in region B, the increased driving current could move operation towards region C, but remains in region B. However, if the system is currently operating in region B, the increase in current results in a spectrum having fringes that are slightly smaller, and includes comparatively small humps, the laser diode 110 is likely moving to operation in region C. But, since the current increase by the perturbation is comparatively small, operation in region D is avoided. Notably, and as discussed more fully below, the impact of operating temperature of the laser diode 110 can move operation of the laser diode 110 toward region D. By the present teachings, adjustments in the driving current to the laser diode by the processor 125 will prevent the laser diode from reaching region D.

Finally, and as described in greater detail in connection with the representative embodiments of FIG. 5, the present teachings contemplate adjusting the operating temperature of the laser diode 110. Notably, changes in the operating temperature of the laser diode 110 will cause the curve 390 to shift to the left or to the right. Instructions in the memory will cause the driving current to be changed to compensate for the drift in the output wavelength of the laser diode 110 caused by temperature changes. The temperature effect is slow and the feedback is fast enough to adjust for the drift.

FIG. 4 is a flow-chart of a method 400 of stabilizing an output of a laser diode in accordance with a representative embodiment. Many aspects and details of the method 400 are common to those described in connection with the representative embodiments of FIGS. 1-3. These common aspects and details may not be repeated.

Notably, the method 400 may be implemented as instructions (code) stored in memory 127, and executed by the processor 125. As noted above, the functions of the controller 126, the processor and the memory may be instantiated in hardware, or in a combination of hardware and software.

At 401, the method begins. At 402 case number 0 is recorded, and at 403 count number 0 is also recorded.

At 404, a scan of the F/P is carried out, and the locations of and power of the peaks are recorded at 405. As discussed above, if discernable (i.e., in regions B or C) these peaks are the coherent fringes 350, 360 depicted in FIG. 3. Notably, however, if the peaks are not discernable (e.g., operation in regions A or D of FIG. 3) then the output is noise, not significant, and the diode current is increased by an amount that will set the fringe 390 in either region B or region C.

At 406 the count is advanced, and 404-406 are repeated and until the count reaches 3 at 407. At this point the average power of the three previous scans is recorded, and the current power is set to the average power.

At 409, the case number is checked and if is set to 0, the driving current is increased. For purposes of illustration, the change in magnitude is 0.05 mA, although this is dependent on the particular laser diode being used. At 411 the previous peak is set to the current peak. The method then advances to case 1 at 412. The method returns to 403 and 403-409 are repeated.

At 413 value of the case variable is checked and if the case is 1, the method proceeds to 414. At 414, the current peak locations and power of the coherent peaks are compared. If the current peak power is greater than the previous peak power multiplied by a first threshold (defined as a percentage value and dependent on the specific laser diode being used), a new current peak is set at 415. Notably, this increase in peak power means a better operating current level has been found and is maintained. Just by way of illustration, if before the current perturbation in the driving current produced a spectrum somewhat similar to region C (or having power levels between regions B and C), the perturbation (in this case a decrease in the driving current) may have caused the laser diode 110 to move into region B, thus improving operation. Moreover, the change in the peak power during operation in region B can also result in operation at another useful operational point in region B.

If at 415 the previous peak power is set to the current peak power, the method continues at 416, and therefore the method continues to 403, and proceeds iteratively until an average of three scans are completed (i.e., the count is 3 at 407). Then the method continues at 409.

If at 414, the current peak is not greater than the previous peak power times a first threshold percentage the method continues to 417 where the driving current to the laser diode 110 is decreased. As noted above, if the current peak power is less than the previous peak power times a threshold after the perturbation increase in the current, the system 100 is not operating at a desirable point, and may be an indication of a slide to operation outside of region B. Notably, a shift in operation within region B could cause a slight change in power but the THRESH1 and THRESH2 are value that discriminate these cases.

At 418 the case is set to 2 and the method returns to 403 and the sequence repeats.

Returning to 413, if the case is not 1, the method proceeds to 419. If the case is 2, the method continues at 420 and the perturbation driving current is decreased to effect a perturbation in the opposite direction. At 421 the previous peak power is set to the current peak power, and the method advances to 422, where case 3 is assigned. The method then returns to 403 and 403-409 are repeated.

If at 419 the case is not 2, the method advances to 423, where the case is advanced to 3, and proceeds to 424 to determine if the current peak power is greater than the previous peak power times a second threshold (defined as a percentage value and dependent on the particular laser diode being used). If this is the case, the method advances to 426 and in view of the improvement in the power, the current peak power is set to the previous peak power. At this point, the method returns to 402 and the method continues as described above.

If at 424 the current peak power is not greater than the previous peak power times a second threshold, the method advances to 427 to increase the diode current, which brings the system 100 to the starting point that was already the optimum. The method 400 then proceeds to 402, and the method 400 continues as described above.

FIG. 5 is a flow-chart of a method 500 of stabilizing an output of a laser diode in accordance with another representative embodiment. Many aspects and details of the method 500 are common to those described in connection with the representative embodiments of FIGS. 1-4. These common aspects and details may not be repeated.

Notably, the method 500 may be implemented as instructions (code) stored in memory 127, and executed by the processor 125 based on data retrieved by the thermistor 131. The processor 125 then issues commands to the TEC feedback controller 130 to change to the operating temperature of the laser diode 110 as describe below. As noted above, the functions of the controller 126, the processor 125 and the memory 127 may be instantiated in hardware, or in a combination of hardware and software.

At 501, the method begins. At 502 case number 0 is recorded, and at 503 count number 0 is also recorded.

At 503 the driving current is compared to a maximum threshold current, which is stored as an absolute value. If the driving diode current is greater than the maximum threshold current, the temperature of the laser diode 110 is decreased at 504 using the TEC feedback controller 130 based on commands generated by the processor 125 using instructions (code) stored in the memory 127.

If, at 503 the driving diode current is found to be less than the than the maximum threshold current, the method advances to 505. At 505 the driving current to the laser diode 110 is compared to a minimum threshold current, which is also measured as an absolute value. If the driving diode current is found to be less than the minimum threshold current, the method advances to 506 and the temperature of the laser diode 110 is increased using the TEC feedback controller 130 based on commands generated by the processor 125 using instructions (code) stored in the memory 127.

If, at 505, the driving diode current is not found to be less than the minimum threshold current, the method advances to 507 where the count is recorded as zero.

At 508, a scan of the F/P is carried out, and the locations of and power of the peaks are recorded at 509. As discussed above, if discernable (i.e., in regions B or C), these peaks are the coherent fringes 350, 360 depicted in FIG. 3. Notably, however, if the peaks are not discernable (e.g., operation in regions A or D of FIG. 3) then the output is noise, not significant, and the diode current is increased by an amount that will set the curve 390 in either region B or region C.

At 510 the count is advanced, and 508-511 are repeated and until the count reaches 3 at 511. At this point the average power of the three previous scans is recorded, and the current power is set to the average power. When count 3 is reached, the current power of the laser diode 110 is set to the average power, and the method 500 continues to 514. If at 514 the case is equal to 0, the method 500 continues to 515, and the driving diode current is increased. Again, for purposes of illustration, the change in magnitude is 0.05 mA, although this is dependent on the particular laser diode being used. At 516 the previous peak power is set to the current peak power. The method then advances to case 1 at 517. The method returns to 504 and 504-512 are repeated.

At 518 value of the case variable is checked, and if the case is 1, the method 500 proceeds to 519. At 519, a first previous peak power is compared to the current peak power. If the current peak power is greater than the previous peak power times a first threshold, the method 500 advances to 520, and the previous peak is set to the current peak. Notably, this increase in peak power means a better operating current level has been found and is maintained. Just by way of illustration, if before the current perturbation in the driving current produced a spectrum somewhat similar to region C (or having power levels between regions B and C), the perturbation (in this case a decrease) in the driving current may have caused the laser diode 110 to move into region B, thus improving operation. The change in the peak power during operation in region B can also result in operation at another working point in region B.

If at 519 the current peak is not greater than the previous peak times a first threshold, the method 500, the method advances to 521 and the driving diode current is decreased. Again, for purposes of illustration, the change in magnitude is 0.05 mA, although this is dependent on the particular laser diode being used.

The method 500 advances to case 2 at 522. The method returns to 504 and 504-512 are repeated.

At 523 value of the case variable is checked, and if the case is 2, the method 500 proceeds to 524 and the diode current is decreased by the processor 125.

At 525 the previous peak is set to the current peak, and the method advances to 526 where the case is recorded at 3. The method 500 then advances to 507 and the method continues as described above.

If, at 523, the count does not equal 2, the method advances to 527 where the case equals 3.

At 528 the method 500 compares a previous peak to the current peak. If the second previous peak times a second threshold is less than the current peak, the method advances to 529 and the previous peak is set to the current peak, and the method continues at 502.

If, at 528, the current peak is not greater than the previous peak times a second threshold, the method advances to 530, the current is increased and the method continues at 502.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

One or more embodiments of the disclosure may be referred to herein, individually and/or collectively, by the term "teachings" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72 (b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A system, comprising:
   a laser diode adapted to output an optical signal having a wavelength;
   an interferometer adapted to receive a portion of the optical signal from the laser diode;
   a controller comprising a processor and coupled to the laser diode and the interferometer, the controller comprising a memory that stores instructions, which when executed by the processor cause the processor to:
   receive the optical signal from the interferometer;
   determine a first amplitude peak of the optical signal received from the interferometer;
   compare the first amplitude peak to a previous amplitude peak;
   increase a driving current to the laser diode;
   determine a second amplitude peak of the optical signal received from the interferometer;
   compare the second amplitude peak to the first amplitude peak; and
   based on the comparison of the second amplitude peak to the first amplitude peak, increase or decrease the driving current to the laser diode so the optical signal received from the interferometer is maintained in a desired wavelength.

2. The system of claim 1, wherein the interferometer is a Fabry-Perot resonator.

3. The system of claim 2, wherein the Fabry-Perot (F/P) resonator is a fiber F/P resonator.

4. The system of claim 2, wherein the system further comprises an actuator that alters a spacing between mirrors of the F/P resonator to scan different resonant conditions.

5. The system of claim 1, wherein when the second amplitude peak has a power less than a power of the first amplitude peak, the processor decreases the driving current to the laser diode.

6. The system of claim 5, wherein, after decreasing the driving current to the laser diode, the processor is further configured to:
   determine a third amplitude peak;
   compare the second amplitude peak to the third amplitude peak; and
   when the third amplitude peak has a power less than the power of the second amplitude peak, further decrease the driving current to the laser diode.

7. The system of claim 5, wherein after decreasing the driving current to the laser diode, the processor is further configured to:
   determine a third amplitude peak;
   compare the second amplitude peak to the third amplitude peak; and
   when the third amplitude peak has a power greater than the power of the second amplitude peak, maintain the driving current to the laser diode at a present level.

8. The system of claim 5, wherein after decreasing the driving current to the laser diode, the processor is further configured to: determine a third amplitude peak; compare the second amplitude peak to the third amplitude peak; and when the third amplitude peak has a power less than the power of the second amplitude peak, decrease the driving current to the laser diode from a present level.

9. The system of claim 5, wherein, after increasing the driving current to the laser diode, the processor is further configured to:
   determine a third amplitude peak;
   compare the second amplitude peak to the third amplitude peak; and
   when the third amplitude peak has a power less than the power of the second amplitude peak, decrease the driving current to the laser diode.

10. The system of claim 1, further comprising:
    a thermistor and a thermoelectric cooler connected to the laser diode, wherein the memory stores further instructions, which when executed by the processor cause the processor to receive temperature data of the laser diode from the thermistor, and based on the temperature data, to change or maintain an operating temperature of the laser diode.

11. A controller, comprising:
    a processor;
    a tangible and non-transitory memory that stores instructions, which when executed by the processor cause the processor to:
    receive an optical signal from an interferometer;

determine a first amplitude peak of the optical signal received from the interferometer;
compare the first amplitude peak to a previous amplitude peak;
increase a driving current to a laser diode;
determine a second amplitude peak of the optical signal received from the interferometer;
compare the second amplitude peak to the first amplitude peak; and
based on the comparison of the second amplitude peak to the first amplitude peak, increase or decrease the driving current to the laser diode so the optical signal received from the interferometer is maintained in a desired operating point.

12. The controller of claim 11, wherein the interferometer is a Fabry-Perot (F/P) resonator.

13. The controller of claim 11, wherein the F/P resonator is a fiber F/P resonator.

14. The controller of claim 11, wherein when the second amplitude peak has a power less than a power of the first amplitude peak, the processor decreases the driving current to the laser diode.

15. The controller of claim 14, wherein, after decreasing the driving current to the laser diode, the processor is further configured to:
determine a third amplitude peak;
compare the second amplitude peak to the third amplitude peak; and
when the third amplitude peak has a power less than the power of the second amplitude peak, further decrease the driving current to the laser diode.

16. The controller of claim 14, wherein after decreasing the driving current to the laser diode, the processor is further configured to:
determine a third amplitude peak;
compare the second amplitude peak to the third amplitude peak; and
when the third amplitude peak has a power greater than the power of the second amplitude peak, maintain the driving current to the laser diode at a present level.

17. The controller of claim 14, wherein after decreasing the driving current to the laser diode, the processor is further configured to:
determine a third amplitude peak;
compare the second amplitude peak to the third amplitude peak; and
when the third amplitude peak has a power less than the power of the second amplitude peak, decrease the driving current to the laser diode from a present level.

18. The controller of claim 14, wherein, after increasing the driving current to the laser diode, the processor is further configured to:
determine a third amplitude peak;
compare the second amplitude peak to the third amplitude peak; and
when the third amplitude peak has a power less than the power of the second amplitude peak, decrease the driving current to the laser diode.

19. The controller of claim 11, wherein the memory stores further instructions, which when executed by the processor cause the processor to receive temperature data of the laser diode, and based on the temperature data, to change or maintain an operating temperature of the laser diode.

20. The controller of claim 12, wherein the memory stores further instructions, which when executed by the processor cause the processor to cause an actuator to alter a spacing between mirrors of the F/P resonator to scan different resonant conditions.

* * * * *